US008575987B2

(12) United States Patent
Kikuchi

(10) Patent No.: US 8,575,987 B2
(45) **Date of Patent: *Nov. 5, 2013**

(54) LEVEL SHIFT CIRCUIT

(75) Inventor: Kazutaka Kikuchi, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/593,010

(22) Filed: Aug. 23, 2012

(65) Prior Publication Data

US 2012/0313686 A1 Dec. 13, 2012

Related U.S. Application Data

(62) Division of application No. 13/012,328, filed on Jan. 24, 2011.

(30) Foreign Application Priority Data

Jan. 25, 2010 (JP) ................................ 2010-013099

(51) Int. Cl.
*H03L 5/00* (2006.01)

(52) U.S. Cl.
USPC ............................... 327/333; 326/80; 326/81

(58) Field of Classification Search
USPC ................................ 327/333; 326/80, 81, 68
See application file for complete search history.

(56) References Cited

U.S. PATENT DOCUMENTS 4,486,670 A * 12/1984 Chan et al. ...................... 326/81
4,593,212 A * 6/1986 Svager ........................... 326/71
4,958,091 A * 9/1990 Roberts .......................... 326/81
4,978,870 A * 12/1990 Chen et al. ...................... 326/68
6,005,432 A * 12/1999 Guo et al. ...................... 327/333
7,119,578 B2 * 10/2006 Correale et al. ................ 326/81
7,446,566 B1 * 11/2008 Chrudimsky .................. 326/68
7,671,629 B2 * 3/2010 Zhang et al. .................... 326/81
7,969,191 B2 * 6/2011 Nedalgi .......................... 326/81
2011/0181339 A1 * 7/2011 Kikuchi ....................... 327/333

FOREIGN PATENT DOCUMENTS

JP 7-226670 A 8/1995
JP 10-336007 A 12/1998
JP 2002-100978 A 4/2002

OTHER PUBLICATIONS

Japanese Office Action issued Sep. 24, 2013 in corresponding Japanese Patent Application No. 2010-013099.

* cited by examiner

*Primary Examiner* — Ryan Jager
(74) *Attorney, Agent, or Firm* — Sughrue Mion, PLLC

(57) ABSTRACT

A level shift circuit of the invention includes a CMOS inverter circuit that receives an input pulse signal having a crest value of a first potential, a latch circuit that operates on a power supply of a second potential which is higher than the first potential, and a power supply circuit that supplies a power supply of not less than the first potential and less than the second potential to the CMOS inverter circuit. The latch circuit has one end thereof connected to an output end of the CMOS inverter circuit and outputs from the other end thereof an output pulse signal having a crest value of the second potential and a same phase as the input pulse signal. The power supply circuit functions to limit the power supply when the input pulse signal assumes at least the ground level.

11 Claims, 9 Drawing Sheets

LEVEL SHIFT CIRCUIT

CROSS REFERENCE TO RELATED APPLICATIONS

This application is a Divisional of U.S. patent application Ser. No. 13/012,328, filed Jan. 24, 2011, which claims priority to Japanese Patent Application No. 2010-013099, filed Jan. 25, 2010, the contents of all of which are incorporated herein by reference.

TECHNICAL FIELD

The present invention relates to a level shift circuit. More specifically, the invention relates to a level shift circuit formed of a CMOS circuit.

BACKGROUND

In semiconductor integrated circuits, it is desirable to use a power supply voltage that is as small as possible in order to reduce power consumption. Accordingly, reduction of the power supply voltage is promoted in the semiconductor integrated circuits. On the other hand, traditional integrated circuits using a high power supply voltage remain used. For this reason, plural types of power supply voltages must be sometimes prepared and switched for use in a same system. When connecting integrated circuits having different power supply voltages, it is necessary to convert a signal voltage using a level shift circuit.

A CMOS level shift circuit is known among such level shift circuits. In this case, a through-current constantly flows between PMOS and NMOS transistors in the CMOS level shift circuit with a simple structure, so that there is a problem that power consumption is large. Then, a CMOS level shift circuit that prevents a through-current flow is described in Patent Document 1.

FIG. 9 is a circuit diagram of the CMOS level shift circuit described in Patent Document 1. Referring to FIG. 9, N-type MOS transistors 14 and 15 are connected in series between a power supply voltage and ground. A signal supplied from an external input terminal 11 is transmitted to a gate of the N-type MOS transistor 15 through an inverter 12, and is also transmitted to a gate of the N-type MOS transistor 14 through the inverter 12 and an inverter 13. A HIGH-output positive feedback circuit formed of an inverter 17 and a P-type MOS transistor 16 is connected to respective drains of the N-type MOS transistors 14 and 15. The inverters 12 and 13 are inverters that operate on a low-voltage power supply.

The signal with a low voltage is supplied from the external input terminal 11 and a high-voltage signal obtained by level shifting the low-voltage signal is extracted from an external output terminal 18 in such a CMOS level shift circuit. In this case, the input signal is supplied to the N-type MOS transistor 14 through the inverters 12 and 13, and the input signal is supplied to the N-type MOS transistor 15 through the inverter 12. Thus, one of the N-type MOS transistors 14 and 15 constantly turns off. Accordingly, no through-current flows across the N-type MOS transistors 14 and 15 in a normal state.

Patent Document 1: JP Patent Kokai Publication No. JP-A-7-226670

SUMMARY

The entire disclosure of Patent Document 1 is incorporated herein by reference thereto.

The following analysis is given by the present invention.

When the signal supplied to the external input terminal 11 rises from the ground level to a level of a low voltage (which is set to VDD1) in the CMOS level shift circuit in FIG. 9, the N-type MOS transistor 15 turns off, and the N-type MOS transistor 14 turns on. Accordingly, the level of the signal at the gate of the N-type MOS transistor 14 connected to an output of the inverter 13 also rises to the VDD1 level. A voltage at the external output terminal 18 rises to a value obtained by subtracting the threshold voltage of the N-type MOS transistor 14 from the voltage VDD1. When this value exceeds the threshold value of the inverter 17, an output of the inverter 17 assumes the ground level. Then, the P-type MOS transistor 16 turns on, and the voltage at the external output terminal 18 reaches to a level of a high voltage (which is set to VDD2). Level shifting is thereby performed.

When the signal supplied to the external input terminal 11 rises from the ground level to the VDD1 level, the level of the signal at the gate of the N-type MOS transistor 14 also rises to reach the VDD1 level. In this case, a signal level at a source of the N-type MOS transistor 14 or an input end of the inverter 17 assumes a value obtained by subtracting the threshold voltage of the N-type MOS transistor 14 from the voltage VDD1. The signal level at the input end of the inverter 17 is not raised to exceed that value as long as the P-type MOS transistor 16 does not turn on. For this reason, when the VDD1 voltage is low and the threshold value of the inverter 17 is high (the value of the voltage VDD2 is high), a period of time taken for the output of the inverter 17 to be inverted or the period of time taken for the P-type MOS transistor 16 to turn on becomes long. Thus, an operating frequency of the level shift circuit is limited. That is, an operating range for the level shifting may not be widened depending on the values of the voltages VDD1 and VDD2. Thus there is much to be desired in the art.

According to first aspect of the present invention, there is provided a level shift circuit comprising: a CMOS inverter circuit that receives an input pulse signal having a crest value of a first potential, a latch circuit that operates on a power supply of a second potential which is higher than the first potential, and a power supply circuit that supplies a power supply of not less than the first potential and less than the second potential to the CMOS inverter circuit. The latch circuit has one end thereof connected to an output end of the CMOS inverter circuit, and outputs from the other end thereof an output pulse signal having a crest value of the second potential and a same phase as the input pulse signal. The power supply circuit functions to limit the power supply when the input pulse signal assumes at least a ground level.

The meritorious effects of the present invention are summarized as follows.

According to the present invention, an operating range for level shifting can be widened.

BRIEF DESCRIPTIONS OF THE DRAWINGS

FIG. 8 is a time chart showing an operation when the level shift circuit according to the sixth example of the present invention is powered on.

PREFERRED MODES

Figure 1:
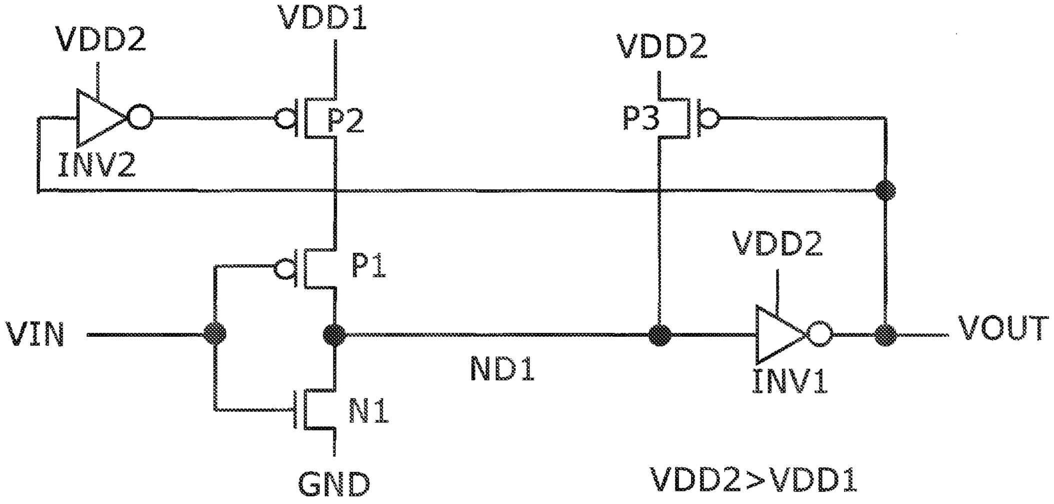
FIG. 1 is a circuit diagram of a level shift circuit according to a first example of the present invention.

A level shift circuit according to an exemplary embodiment of the present invention comprises a CMOS inverter circuit (P1, N1 in FIG. 1) that receives an input pulse signal (VIN in FIG. 1) having a crest value of a first potential (VDD1 in FIG. 1), a latch circuit (INV1, P3 in FIG. 1) that operates on a power supply of a second potential (VDD2 in FIG. 1) which is higher than the first potential, and a power supply circuit (corresponding to P2, INV2 in FIG. 1) that supplies a power supply of not less than the first potential and less than the second potential to the CMOS inverter circuit. The latch circuit has one end (ND1 in FIG. 1) connected to an output end of the CMOS inverter circuit. The latch circuit outputs from the other end thereof an output pulse signal (VOUT in FIG. 1) having a crest value of the second potential and a same phase as the input pulse signal. The power supply circuit functions to limit the power supply when the input pulse signal assumes at least a ground level.

The power supply circuit in the level shift circuit may include a reverse current blocking circuit that operates to block current from flowing from a power supply terminal of the CMOS inverter circuit to a power supply side of the CMOS inverter circuit when the input pulse signal assumes the ground level.

The reverse current blocking circuit in the level shift circuit may comprise a blocking MOS transistor (P2 in FIG. 1) inserted between the power supply side of the CMOS inverter circuit and the power supply terminal of the CMOS inverter circuit and having a same conductivity type as an MOS transistor that is present on the power side of the CMOS inverter circuit, and a blocking inverter circuit (INV2 in FIG. 1) with an input end thereof connected to the output end of the latch circuit and an output end thereof connected to a gate of the blocking MOS transistor.

The level shift circuit may comprise two resistance elements (R1, R2 in FIG. 4) connected in series between the power supply of the second potential and a ground, and the power supply may be supplied to the CMOS inverter circuit from a connecting point between the two resistance elements through the blocking MOS transistor.

The power supply circuit in the level shift circuit may be formed of two resistance elements (R1, R2 in FIG. 5) connected in series between the power supply of the second potential and a ground, and the power supply may be supplied to the CMOS inverter circuit from a connecting point between the two resistance elements.

The latch circuit in the level shift circuit may comprise an output stage inverter circuit (INV in FIG. 1) having an input end and an output end, the input end being the one end of the latch circuit and the output end being the other end of the latch circuit, and a latch-stage MOS transistor (P3 in FIG. 1) with a source thereof connected to the power supply of the second potential, a drain thereof connected to the one end of the latch circuit, and a gate thereof connected to the other end of the latch circuit. The latch-stage MOS transistor has a same conductivity as an MOS transistor that is present on a power supply side of the CMOS inverter circuit.

The latch circuit in the level shift circuit may further comprise a through-current preventing MOS transistor (P4 in FIG. 2) with a gate thereof connected to an input end of the CMOS inverter circuit, a drain thereof connected to the one end of the latch circuit, and a source thereof connected to the drain of the latch-stage MOS transistor. The through-current preventing MOS transistor has a same conductivity type as the latch-stage MOS transistor. The drain of the latch-stage MOS transistor may be connected to the source of the through-current preventing MOS transistor instead of being connected to the one end of the latch circuit.

In the latch circuit in the level shift circuit, the drain of the latch-stage MOS transistor (P3 in FIG. 3) may be connected to the power supply side of the CMOS inverter circuit instead of being connected to the one end of the latch circuit.

Figure 6:
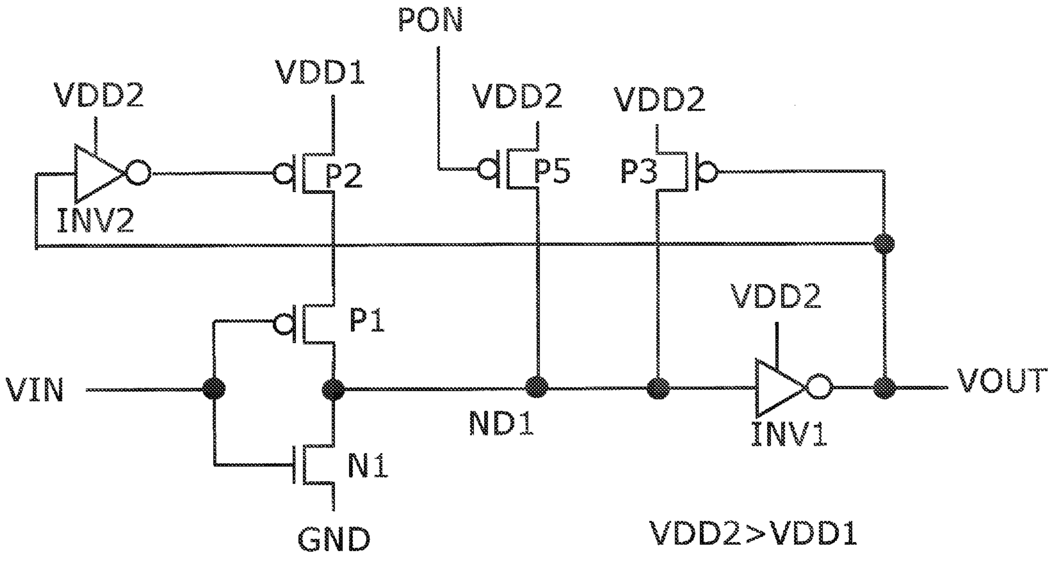
FIG. 6 is a circuit diagram of a level shift circuit according to a sixth example of the present invention.

The level shift circuit may further comprise an initialization circuit that allows the one end of the latch circuit to be short-circuited to the power supply of the second potential by an initialization signal (PON in FIG. 6).

The initialization circuit in the level shift circuit may comprise an initializing MOS transistor (P5 in FIG. 6) with a source thereof connected to the power supply of the second potential and a drain thereof connected to the one end of the latch circuit. The initialization signal is supplied to a gate of the initializing MOS transistor. The initializing MOS transistor has a same conductivity type as a MOS transistor that is present on the power supply side of the CMOS inverter circuit.

According to the level shift circuit as described above, when the input pulse signal changes from the first potential to the ground level, a potential at the one end of the latch circuit is raised to a potential equal to or larger than the first potential. Accordingly, a period of time taken for the latch circuit to transition can be shortened more than in a related art level shift circuit. An operating range for level shifting can be thereby widened.

It should be noted that reference to the drawings by way of symbols mentioned herein above in the description of the preferred modes is not intended as limitative thereto. Rather it is intended merely for better illustration and understanding.

A detailed description will be given in connection with examples, with reference to drawings.

First Example

FIG. 1 is a circuit diagram of a level shift circuit according to a first example of the present invention. Referring to FIG. 1, the level shift circuit includes inverter circuits INV1 and INV2, an NMOS transistor N1, and PMOS transistors P1, P2, and P3.

A drain of the NMOS transistor N1 is connected to a node ND1 and a source of the NMOS transistor N1 is grounded. An input signal VIN is supplied to a gate of the NMOS transistor N1. A drain of the PMOS transistor P1 is connected to the node ND1, and a source of the PMOS transistor P1 is connected to a power supply VDD1 through the PMOS transistor P2. The input signal VIN is supplied to a gate of the PMOS transistor P1. The NMOS transistor N1 and the PMOS transistor P1 form a CMOS inverter circuit.

The inverter circuit INV1 operates on a power supply VDD2. An input end of the inverter circuit INV1 is connected to the node ND1. The inverter circuit INV1 outputs an output signal VOUT from an output end thereof. A source of the PMOS transistor P3 is connected to the power supply VDD2. A gate of the PMOS transistor P3 is connected to the output end of the inverter circuit INV1. A drain of the PMOS transistor P3 is connected to the input end (node ND1) of the inverter circuit INV1. The inverter circuit INV1 and the PMOS transistor P3 form a latch circuit. The power supply VDD2 is set to be higher than the power supply VDD1.

The inverter circuit INV2 operates on the power supply VDD2. An input end of the inverter circuit INV2 is connected to the output end of the inverter circuit INV1. An output end of the inverter circuit INV2 is connected to a gate of the PMOS transistor P2. A source of the PMOS transistor P2 is connected to the power supply VDD1, and a drain of the PMOS transistor P2 is connected to the source of the PMOS transistor P1. The inverter circuit INV2 and the PMOS transistor P2 form a power supply circuit that supplies a power supply to the CMOS inverter circuit.

When the input signal VIN is at a VDD1 level in the level shift circuit configured as described above, the NMOS transistor N1 is on, the node ND1 is at the ground level, and an output signal VOUT assumes a VDD2 level obtained by level shifting. For this reason, the PMOS transistor P3 of which the gate is at the VDD2 level is in an off state. The output end of the inverter circuit INV2 of which the input end is at the VDD2 level or the gate of the PMOS transistor P2 is at the ground level. Thus, the PMOS transistor P2 is on state.

When the input signal VIN falls from the VDD1 level to the ground level, the NMOS transistor N1 turns off, the PMOS transistor P1 turns on, and the node ND1 rises from the ground level to the VDD1 level. When the potential at the node ND1 exceeds the threshold value of the inverter circuit INV1, the output signal VOUT inverts to the ground level. Accordingly, the PMOS transistor P3 turns on to further raise the potential at the node ND1 to the VDD2 level. On the other hand, the output end of the inverter circuit INV2 or the gate of the PMOS transistor P2 assumes the VDD2 level. The PMOS transistor P2 thereby turns off. The PMOS transistor P2 on the off state blocks a through-current that flows from the power supply VDD2 to the power supply VDD1 through the PMOS transistor P3 and the PMOS transistor P1 in on state.

Figure 9:
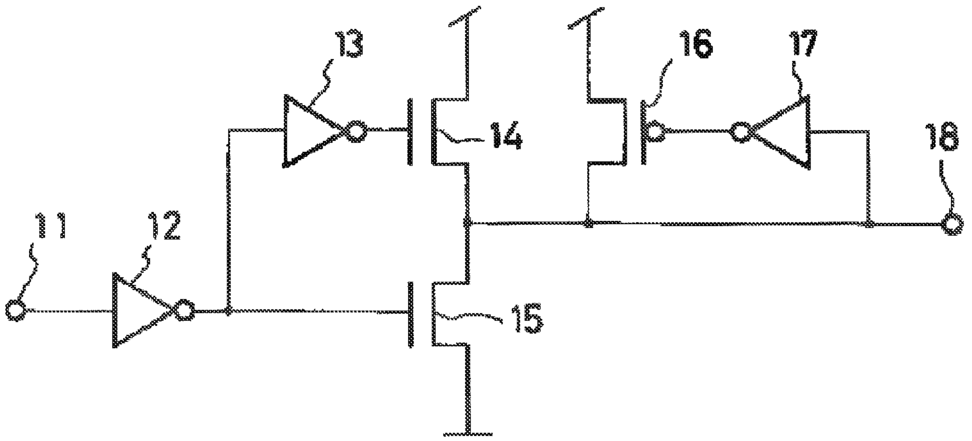
FIG. 9 is a circuit diagram of a related art level shift circuit.

In a CMOS level shift circuit in FIG. 9, a voltage at an external output terminal 18 (corresponding to the node ND1 in this example) rises to a value obtained by subtracting the threshold voltage of an N-type MOS transistor 14 from a voltage VDD1. On contrast therewith, a voltage at the node ND1 in this example rises to a voltage VDD1. For this reason, in this example, a period of time until when a voltage at the input end of the inverter circuit INV1 exceeds the threshold value of the inverter circuit INV1 is shorter than the related art level shift circuit. Accordingly, an operating frequency of the level shift circuit can be made higher than in the related art level shift circuit. In other words, an operating range for level shifting can be widened.

Second Example

Figure 2:
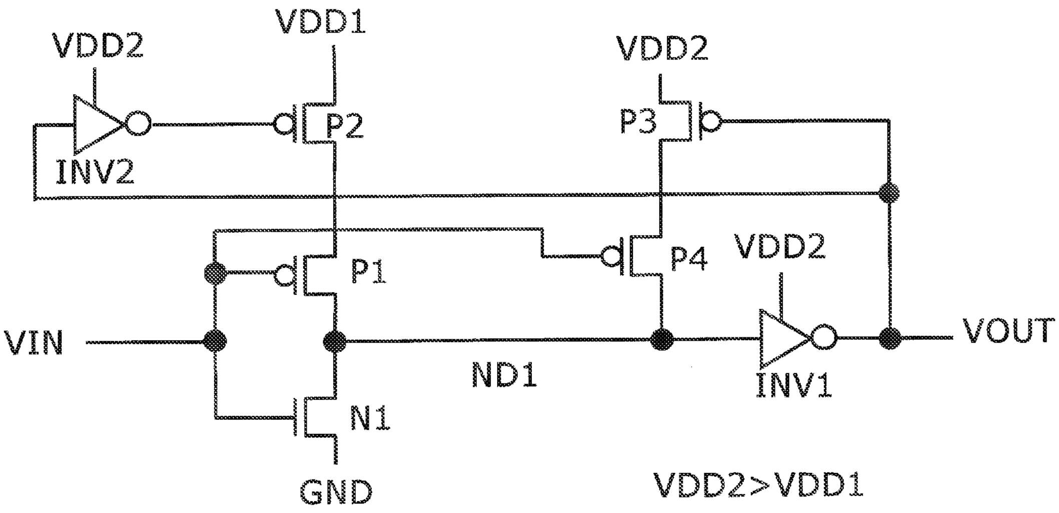
FIG. 2 is a circuit diagram of a level shift circuit according to a second example of the present invention.

FIG. 2 is a circuit diagram of a level shift circuit according to a second example of the present invention. Referring to FIG. 2, same reference numerals are assigned to components that are the same as those in FIG. 1, thereby omitting their descriptions. The level shift circuit in FIG. 2 further includes a PMOS transistor P4 instead of connecting the drain of the PMOS transistor P3 in FIG. 1 to the node ND1. A source of the PMOS transistor P4 is connected to the drain of the PMOS transistor P3, and a drain of the PMOS transistor P4 is connected to the node ND1. An input signal VIN is supplied to a gate of the PMOS transistor P4.

When an input signal VIN is at the ground level in the level shift circuit in FIG. 1, an output signal VOUT is at the ground level and the PMOS transistor P3 is in on state. When the input signal VIN rises to a VDD1 level from the ground level, the NMOS transistor N1 turns on, and a through-current flows from the power supply VDD2 to the ground through the PMOS transistor P3 in the on state and the NMOS transistor N1 in on state.

On contrast therewith, according to the level shift circuit in this example, when the input signal VIN rises to a VDD1 level from the ground level, the PMOS transistor P4 that is present between the PMOS transistor P3 and the NMOS transistor N1 turns off, thereby blocking a through-current that flows from the power supply VDD2 to the ground through the PMOS transistor P3 and the NMOS transistor N1 that are in on state. Accordingly, consumption current in the level shift circuit is reduced.

Third Example

Figure 3:
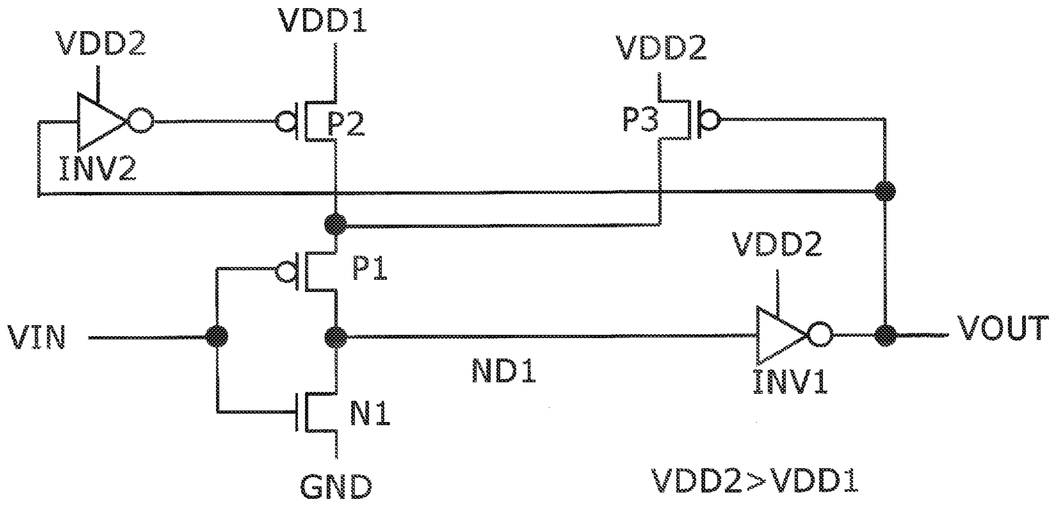
FIG. 3 is a circuit diagram of a level shift circuit according to a third example of the present invention.

FIG. 3 is a circuit diagram of a level shift circuit according to a third example of the present invention. Referring to FIG. 3, same reference numerals are assigned to components that are the same as those in FIG. 1, thereby omitting their descriptions. In the level shift circuit in FIG. 3, the drain of the PMOS transistor P3 in FIG. 1 is connected to the source of the PMOS transistor P1 (drain of the PMOS transistor P2) instead of being connected to the node ND1.

According to the level shift circuit in this example, when an input signal VIN rises from the ground level to a VDD1 level, the PMOS transistor P1 that is present between the PMOS transistor P3 and the NMOS transistor N1 turns off, thereby blocking a through-current that flows from the power supply VDD2 to the ground through the PMOS transistor P3 and the NMOS transistor N1 that are in on state. Accordingly, consumption current in the level shift circuit is reduced, as in the second example.

Fourth Example

Figure 4:
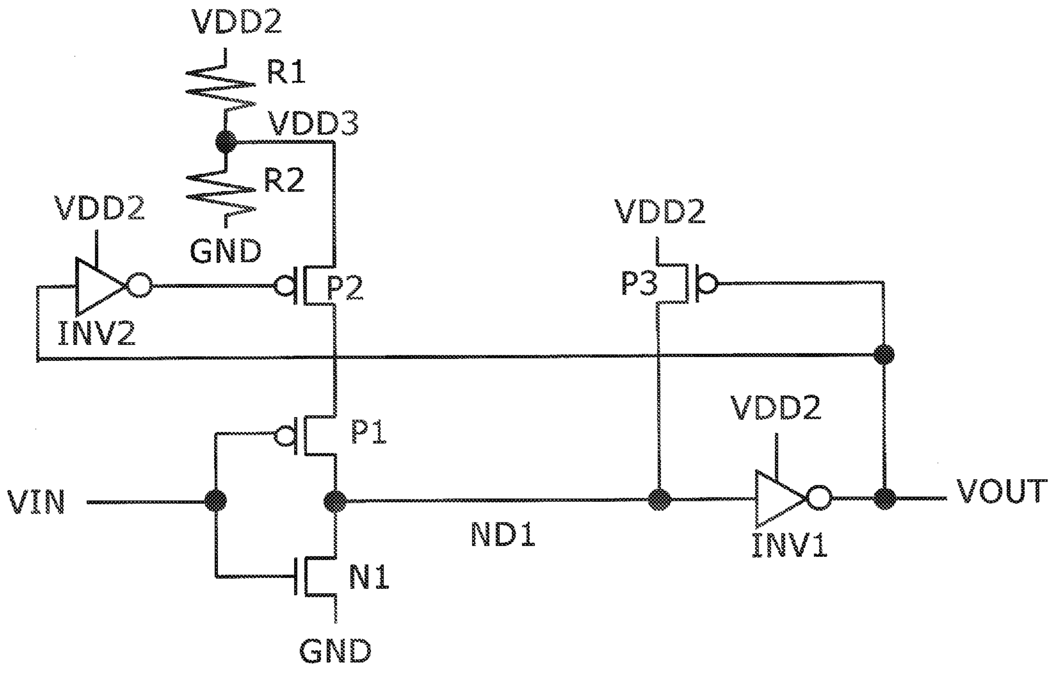
FIG. 4 is a circuit diagram of a level shift circuit according to a fourth example of the present invention.

FIG. 4 is a circuit diagram of a level shift circuit in a fourth example of the present invention. Referring to FIG. 4, same reference numerals are assigned to components that are the same as those in FIG. 1, thereby omitting their descriptions. In the level shift circuit in FIG. 4, the source of the PMOS transistor P2 in FIG. 1 is connected to a connecting point between two resistance elements R1 and R2 that are connected in series between the power supply VDD2 and the ground, instead of being connected to the power supply VDD1. When a potential at this connecting point is set to VDD3, it is preferable that values of the resistance elements R1 and R2 be set so that the potential VDD3 satisfies the following relational expression (1):

$$VDD2 > (VDD1 + VTP1) \geq VDD3 > Vt \qquad \text{Expression (1)}$$

where VTP1 indicates the threshold value of the PMOS transistor P1, and Vt indicates the threshold value (inverted level) of the inverter circuit INV1. When an upper limit of the potential VDD3 exceeds (VDD1+VTP1) in the expression (1), and when an input signal VIN is at a VDD1 level, the PMOS transistor P1 does not completely turn off. A through-current will thereby occur. When a lower limit of the potential VDD3 is equal to or less than the threshold value Vt in the expression (1), an output of the inverter circuit INV1 cannot be inverted. Preferably, the potential VDD3 is equal to or larger than VDD1, and is as high as possible within the range of the expression (1), in order for the level shift circuit to operate at a higher speed.

When the input signal VIN falls from the VDD1 level to the ground level in the level shift circuit configured as described above, the NMOS transistor N1 turns off, and the PMOS transistor P1 turns on, as described in the first example. In this case, the node ND1 rises from the ground level to a VDD3 level. For this reason, a period of time until when a voltage at the input end of the inverter circuit INV1 exceeds the threshold value of the inverter circuit INV1 can be reduced more than in the first example. An operating frequency of the level shift circuit may be therefore further increased.

Fifth Example

Figure 5:
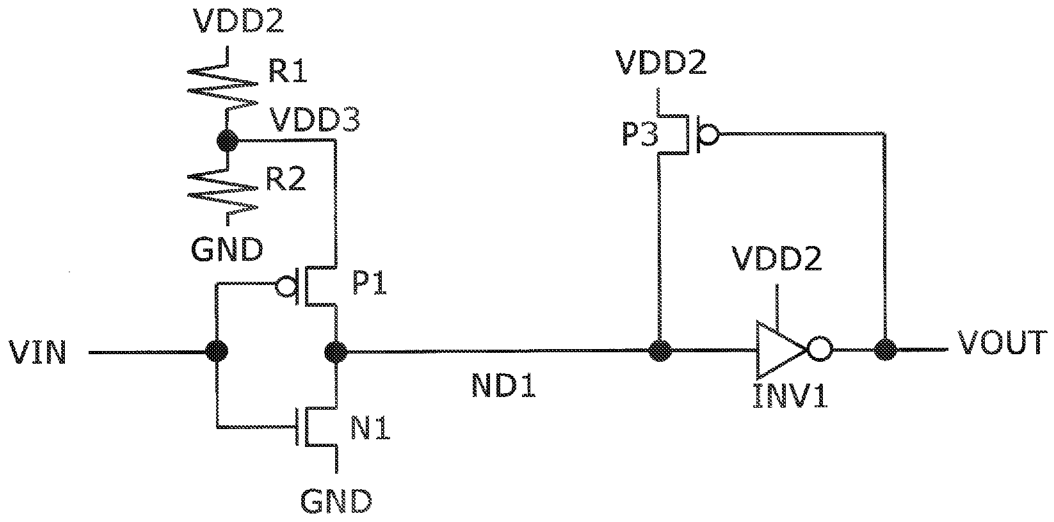
FIG. 5 is a circuit diagram of a level shift circuit according to a fifth example of the present invention.

FIG. 5 is a circuit diagram of a level shift circuit according to a fifth example of the present invention. Referring to FIG. 5, same reference numerals are assigned to components that are the same as those in FIG. 4, thereby omitting their descriptions. In the level shift circuit in FIG. 5, the PMOS transistor P2 and the inverter circuit INV2 in FIG. 4 are eliminated, and the source of the PMOS transistor P1 is directly connected to the connecting point between the two resistance elements R1 and R2.

When an input signal VIN falls from a VDD1 level to the ground level in the level shift circuit configured as described above, the node ND1 rises from the ground level to a VDD3 level, as described in the fourth example. For this reason, an operating frequency of the level shift circuit can be increased more.

Assume that the input signal VIN is at the ground level in FIG. 5. Then, since the PMOS transistor P2 and the inverter circuit INV2 in FIG. 4 are not present, a through-current flows from the power supply VDD2 to the resistance element R2 through the PMOS transistor P3 and the PMOS transistor P1 that are in on state. In this case, consumption current in the level shift circuit may be reduced by setting a value of the resistance element R2 to be high as necessary.

Sixth Example

FIG. 6 is a circuit diagram of a level shift circuit according to a sixth example of the present invention. Referring to FIG. 6, same reference numerals are assigned to components that are the same as those in FIG. 1, thereby omitting their descriptions. The level shift circuit in FIG. 6 further includes a PMOS transistor P5 in the level shift circuit in FIG. 1. A source of the PMOS transistor P5 is connected to the power supply VDD2, and a drain of the PMOS transistor P5 is connected to the node ND1. An initialization signal (power-on reset signal) PON is supplied to a gate of the PMOS transistor P5. When the initialization signal PON is at the ground level at a time of power-on of the level shift circuit, the PMOS transistor P5 turns on, thereby setting the node ND1 to a VDD2 level. The initialization signal PON may be generated by an input from an external PAD not shown or a common power-on reset circuit.

Figure 7:
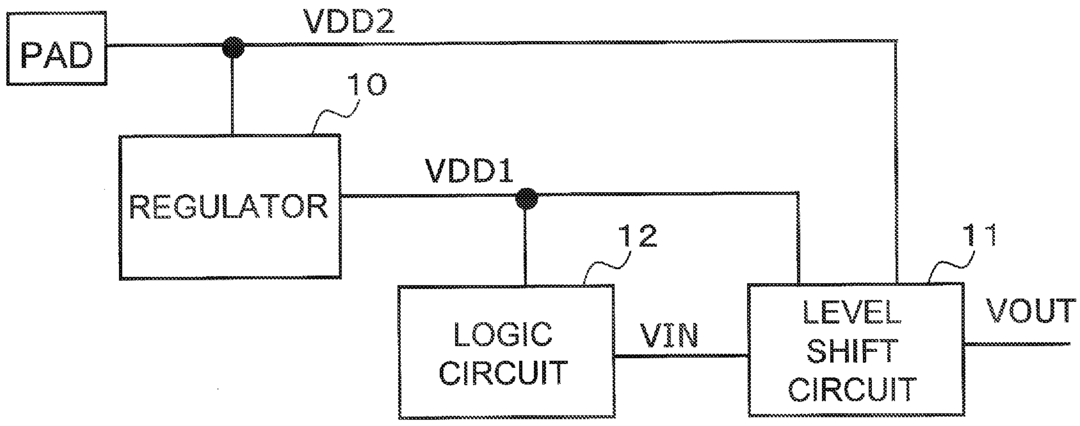
FIG. 7 is a diagram showing a configuration of a system to which the level shift circuit according to the sixth example of the present invention is applied.

FIG. 7 is a diagram showing a configuration of a system to which the level shift circuit according to the sixth example of the present invention is applied. Referring to FIG. 7, a power supply VDD2 supplied from an external terminal PAD is supplied to a regulator 10 and a level shift circuit 11. The regulator 10 reduces the power supply VDD2 to generate a power supply VDD1, and supplies the power supply VDD1 to a logic circuit 12 and the level shift circuit 11. The logic circuit 12 generates an input signal VIN in the level shift circuit 11. A crest value of the input signal VIN may become VDD1.

Figure 8:
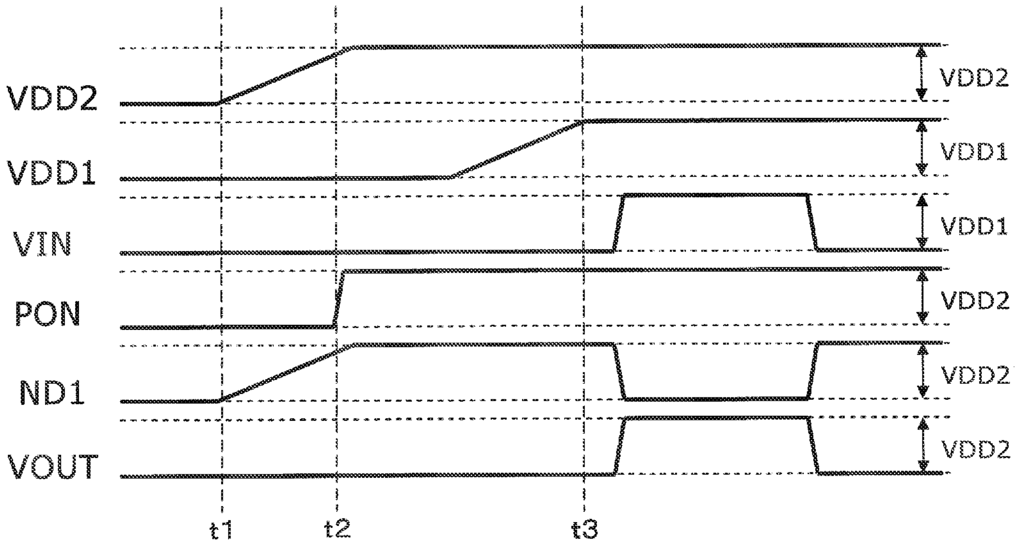

Next, an operation at a time of power-on of the system configured as mentioned above will be described. FIG. 8 is a time chart showing an operation of the level shift circuit according to the sixth example of the present invention at the time of power-on.

Assume that at a timing t1, supply of the power supply VDD2 has been started, and that the power supply VDD2 has assumed a normal value at a timing t2. In this case, the initialization signal PON is set to be at the ground level until the timing t2. Since the PMOS transistor P5 is on, and the NMOS transistor N1 is off, the node ND1 follows a level change of the power supply VDD2 to rise. Even if the initialization signal PON has assumed a VDD2 level after the timing t2, an output signal VOUT maintains the ground level. The PMOS transistor P3 keeps on, and the node ND1 is held at the level of the power supply VDD2.

Assume that the power supply VDD1 has assumed a normal value at a timing t3 due to a delay of the regulator 10. The level shift circuit 11 outputs the output signal VOUT obtained by level shifting the input signal VIN after the timing t3.

As described above, the latch circuit formed of the inverter circuit INV1 and the PMOS transistor P3 maintains an initialization state in which the output signal VOUT is at the ground level due to the initialization signal PON at the time of power-on, and an unstable signal is not output as the output signal VOUT.

Herein, the description was given that the level shift circuit 11 was obtained by adding the PMOS transistor P5 to the level shift circuit in FIG. 1. Needless to say, it may be so arranged that the PMOS transistor P5 is added to the level shift circuit shown in each of FIGS. 2 to 5 to cause the PMOS transistor to function as a similar initialization circuit.

Various preferred modes are possible in the present invention.

Mode 1: As set forth as the first aspect.

Mode 2: The power supply circuit may include a reverse current blocking circuit that operates to block current from flowing from a power supply terminal of the CMOS inverter circuit to a power supply side of the CMOS inverter circuit when the input pulse signal assumes the ground level.

Mode 3: The reverse current blocking circuit may comprise: a blocking MOS transistor inserted between the power supply side of the CMOS inverter circuit and the power supply terminal of the CMOS inverter circuit and having a same conductivity type as an MOS transistor that is present on the power supply side of the CMOS inverter circuit; and a blocking inverter circuit with an input end thereof connected to the output end of the latch circuit and an output end thereof connected to a gate of the blocking MOS transistor.

Mode 4: The level shift circuit may comprise two resistance elements connected in series between the power supply of the second potential and the ground, and the power supply is effected to the CMOS inverter circuit from a connecting point between the two resistance elements through the blocking MOS transistor.

Mode 5: The power supply circuit may be formed of two resistance elements connected in series between the power supply of the second potential and the ground, and the power supply is effected to the CMOS inverter circuit from a connecting point between the two resistance elements.

Mode 6: The latch circuit may comprise: an output stage inverter circuit having an input end and an output end, the input end being the one end of the latch circuit and the output end being the other end of the latch circuit; and a latch-stage MOS transistor with a source thereof connected to the power supply of the second potential, a drain thereof connected to the one end of the latch circuit, and a gate thereof connected to the other end of the latch circuit, the latch-stage MOS transistor having a same conductivity type as an MOS transistor that is present on a power supply side of the CMOS inverter circuit.

Mode 7: The latch circuit further may comprise: a through-current preventing MOS transistor with a gate thereof connected to an input end of the CMOS inverter circuit, a drain thereof connected to the one end of the latch circuit, and a source thereof connected to the drain of the latch-stage MOS transistor, the through-current preventing MOS transistor having a same conductivity type as the latch-stage MOS transistor; and the drain of the latch-stage MOS transistor is connected to the source of the through-current preventing MOS transistor instead of being connected to the one end of the latch circuit.

Mode 8: The drain of the latch-stage MOS transistor in the latch circuit may be connected to the power supply side of the CMOS inverter circuit instead of being connected to the one end of the latch circuit.

Mode 9: The level shift circuit may further comprise: an initialization circuit that allows the one end of the latch circuit to be short-circuited to the power supply of the second potential by an initialization signal.

Mode 10: The initialization circuit may comprise an initializing MOS transistor with a source thereof connected to the power supply of the second potential and a drain thereof connected to the one end of the latch circuit, the initialization signal being supplied to a gate of the initializing MOS transistor, the initializing MOS transistor having a same conductivity type as a MOS transistor that is present on the power supply side of the CMOS inverter circuit Each disclosure of Patent Document described above and the like is incorporated herein by reference. Modifications and adjustments of the exemplary embodiment and examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A level shift circuit comprising:

a CMOS inverter circuit that receives an input pulse signal having a crest value of a first potential;

a latch circuit that operates on a power supply of a second potential which is higher than the first potential, the latch circuit having one end thereof connected to an output end of the CMOS inverter circuit and outputting from the other end thereof an output pulse signal having a crest value of the second potential and a same phase as the input pulse signal;

a power supply circuit that supplies a power supply of not less than the first potential and less than the second potential to the CMOS inverter circuit, and functions to limit the power supply when the input pulse signal assumes at least a ground level; and an initialization circuit that allows the one end of the latch circuit to be short-circuited to the power supply of the second potential by an initialization signal, wherein the power supply circuit comprises a reverse current blocking circuit, the reverse current blocking circuit comprises a blocking MOS transistor inserted between a power supply side of the CMOS inverter circuit and the power supply supplied to the CMOS inverter circuit, a gate of the blocking MOS transistor is coupled to the output pulse signal.

2. The level shift circuit according to claim 1, wherein the initialization circuit comprises an initializing MOS transistor with a source thereof connected to the power supply of the second potential and a drain thereof connected to the one end of the latch circuit, the initialization signal being supplied to a gate of the initializing MOS transistor, the initializing MOS transistor having a same conductivity type as a MOS transistor that is present on the power supply side of the CMOS inverter circuit.

3. The level shift circuit according to claim 1, wherein the reverse current blocking circuit operates to block current from flowing from a power supply terminal of the CMOS inverter circuit to the power supply side of the CMOS inverter circuit when the input pulse signal assumes the ground level.

4. The level shift circuit according to claim 1, wherein the initialization signal is a power-on reset signal.

5. The level shift circuit according to claim 1, further comprising:

a blocking inverter circuit with an input end connected to the output pulse signal and an output end connected to the gate of the blocking MOS transistor.

6. The level shift circuit according to claim 1, wherein the latch circuit comprises an output stage inverter circuit having an input end at the one end of the latch circuit connected to the output end of the CMOS inverter circuit and an output end at the other end of the latch circuit.

7. The level shift circuit according to claim 1, wherein the initialization signal is generated by an input from a common power-on reset circuit.

8. A level shift circuit comprising:

a CMOS inverter circuit that receives an input signal having a first voltage swing;

a latch circuit that outputs an output signal having a second voltage swing which is larger than the first voltage swing based on a voltage level of an output node of the CMOS inverter circuit;

a power supply circuit that is connected between a first power supply and a power supply terminal of the CMOS inverter circuit, and supplies a first power supply to the CMOS inverter circuit in response to the output signal, a potential of the first power supply is lower than a high-level voltage of the second voltage swing; and an initialization circuit that supplies a predetermined voltage level to the output node of the CMOS inverter circuit in response to an initialization signal.

9. A level shift circuit comprising:

a CMOS inverter circuit that receives an input signal having a first voltage swing;

a latch circuit that outputs an output signal having a second voltage swing which is larger than the first voltage swing based on a voltage level of an output node of the CMOS inverter circuit;

a power supply circuit that supplies a power supply to the CMOS inverter circuit based on a voltage level of the output signal, and an initialization circuit that supplies a predetermined voltage level to the output node of the CMOS inverter circuit in response to an initialization signal, wherein the power supply circuit comprises a reverse current blocking circuit, the reverse current blocking circuit comprises a blocking MOS transistor inserted between a power supply side of the CMOS inverter circuit and the power supply supplied to the CMOS inverter circuit, a gate of the blocking MOS transistor is coupled to the output signal.

10. The level shift circuit according to claim 9, wherein the predetermined voltage level is same as a high-level voltage of the second voltage swing.

11. The level shift circuit according to claim 9, further comprising:

a blocking inverter circuit with an input end connected to the output signal and an output end connected to the gate of the blocking MOS transistor.

* * * * *